(12) United States Patent
Lu et al.

(10) Patent No.: US 10,784,133 B2
(45) Date of Patent: Sep. 22, 2020

(54) WAFER CLAMP AND A METHOD OF CLAMPING A WAFER

(71) Applicant: Himax Technologies Limited, Tainan (TW)

(72) Inventors: Fang Wan Lu, Tainan (TW); Jui Tang Chang, Tainan (TW)

(73) Assignee: Himax Techologies Limited, Tainan (TW)

( * ) Notice: Subject to any disclaimer, the term of this patent is extended or adjusted under 35 U.S.C. 154(b) by 0 days.

(21) Appl. No.: 16/583,112

(22) Filed: Sep. 25, 2019

(65) Prior Publication Data

US 2020/0020557 A1    Jan. 16, 2020

Related U.S. Application Data

(62) Division of application No. 15/454,978, filed on Mar. 9, 2017, now Pat. No. 10,483,138.

(51) Int. Cl.
| | | |
|---|---|---|
| *H01L 21/67* | (2006.01) | |
| *H01L 21/687* | (2006.01) | |
| *H01L 21/68* | (2006.01) | |
| *G01V 8/14* | (2006.01) | |

(52) U.S. Cl.
CPC ...... *H01L 21/67259* (2013.01); *H01L 21/681* (2013.01); *H01L 21/68707* (2013.01); *G01V 8/14* (2013.01)

(58) Field of Classification Search
CPC ......... H01L 21/68721; H01L 21/67259; H01L 21/681; H01L 21/68707; G01V 8/14
See application file for complete search history.

(56) References Cited

U.S. PATENT DOCUMENTS

| | | |
|---|---|---|
| 2004/0225408 A1 | 11/2004 | Whitcomb |
| 2005/0265814 A1 | 12/2005 | Coady |
| 2011/0262257 A1 | 10/2011 | Hino |
| 2013/0193703 A1 | 8/2013 | Ando et al. |
| 2014/0308108 A1 | 10/2014 | Fosnight et al. |
| 2015/0044008 A1 | 2/2015 | Tseng et al. |
| 2015/0123417 A1 | 5/2015 | Patoglu |

FOREIGN PATENT DOCUMENTS

| | | | |
|---|---|---|---|
| JP | 2005136280 A | * | 5/2005 |
| JP | 2005136280 A | | 5/2005 |
| TW | 550731 B | | 9/2003 |
| TW | 201135863 A | | 10/2011 |
| WO | WO2005/036635 A1 | | 4/2005 |

OTHER PUBLICATIONS

Extended European Search Report dated Sep. 26, 2017 in related European Application No. 17162148.5.
Office Action dated Jul. 14, 2017 in corresponding Taiwan Patent Application No. 106110018.

* cited by examiner

*Primary Examiner* — Stephen A Vu
(74) *Attorney, Agent, or Firm* — Donald E. Stout; Stout, Uxa & Buyan, LLP

(57) ABSTRACT

A wafer clamp includes a platform with a top surface, a stopper disposed at a front end of the platform, a push rod disposed at a rear end of the platform, at least one actuator pivotally connected to the push rod, and a sensor disposed at the front end of the platform, the sensor measuring a distance between the sensor and a wafer over the sensor.

5 Claims, 6 Drawing Sheets

14

16

WAFER CLAMP AND A METHOD OF CLAMPING A WAFER

CROSS-REFERENCE TO RELATED APPLICATIONS

This application is a divisional application of U.S. application Ser. No. 15/454,978, filed on Mar. 9, 2017, the entire contents of which are hereby expressly incorporated by reference.

BACKGROUND OF THE INVENTION

1. Field of the Invention

The present invention generally relates to a wafer clamp, and more particularly to a wafer clamp adaptable to a robot system for picking and placing a wafer.

2. Description of Related Art

A robotic hand (or fork) of a robot system is commonly utilized for picking and placing a wafer (or chip) automatically. A vacuum fork is conventionally used to hold a wafer. Owing to misalignment usually occurred in the conventional vacuum fork, the wafer cannot be precisely positioned and picked, therefore falling and breaking.

Moreover, the conventional vacuum fork is designed to make physical contact with the top or bottom surface of a wafer to be picked. This type of equipment is not adaptable to a wafer such as an optical component (e.g., an optical lens or glass).

An engaged type fork is provided to overcome disadvantages of the vacuum fork. However, conventional engaged type forks are incapable of fast moving or rotating without being flipped over the wafer.

For the reasons that conventional robotic forks could not effectively position and pick the wafer, a need has thus arisen to propose a novel wafer clamp to overcome the disadvantages of the conventional robotic forks.

SUMMARY OF THE INVENTION

In view of the foregoing, it is an object of the embodiment of the present invention to provide a wafer clamp adaptable to a robot system and a method of clamping a wafer. The provided wafer clamp is capable of precisely positioning a wafer, and is capable of fast moving and rotating without flipping over the wafer.

According to one embodiment, a wafer clamp includes a platform, a stopper, a push rod, at least one actuator, and a sensor. The platform has a top surface. The stopper is disposed at a front end of the platform, and the push rod is disposed at a rear end of the platform. The actuator is pivotally connected to the push rod. The sensor is disposed at the front end of the platform to measure a distance between the sensor and a wafer over the sensor.

According another embodiment, a method of clamping a wafer is disclosed. A wafer clamp is moved forward into a slot with the wafer. A sensor detects presence of the wafer over the sensor. The wafer clamp is continuously moved forward until the sensor detects absence of the wafer. The wafer clamp is moved upward and at least one actuator is actuated to move a push rod forward such that the wafer is held tightly between a stopper and the push rod.

DETAILED DESCRIPTION OF THE INVENTION

Figure 1A:
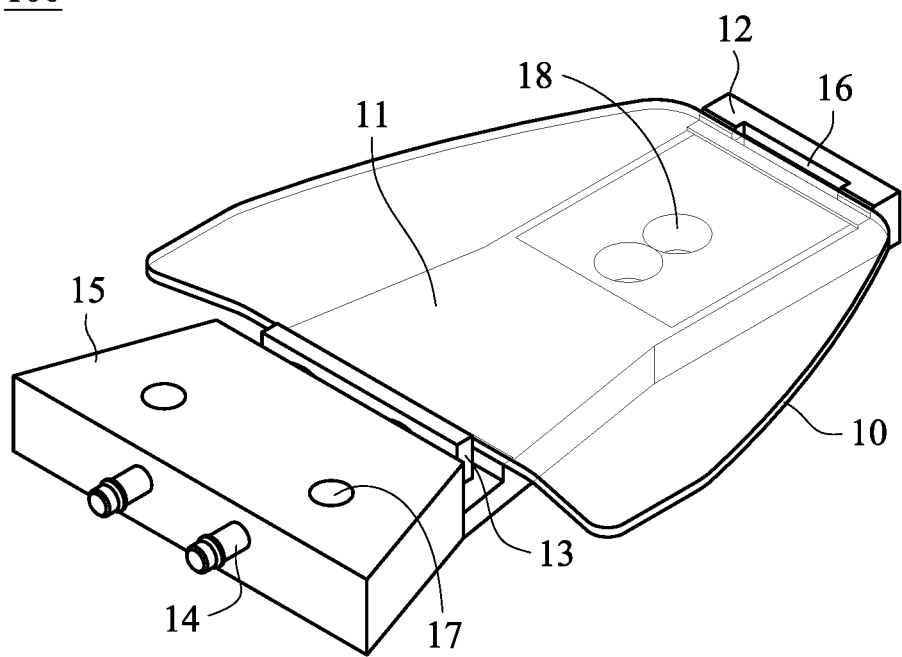
FIG. 1A shows a perspective view of a wafer clamp adaptable to a robot system according to one embodiment of the present invention.
Figure 2:
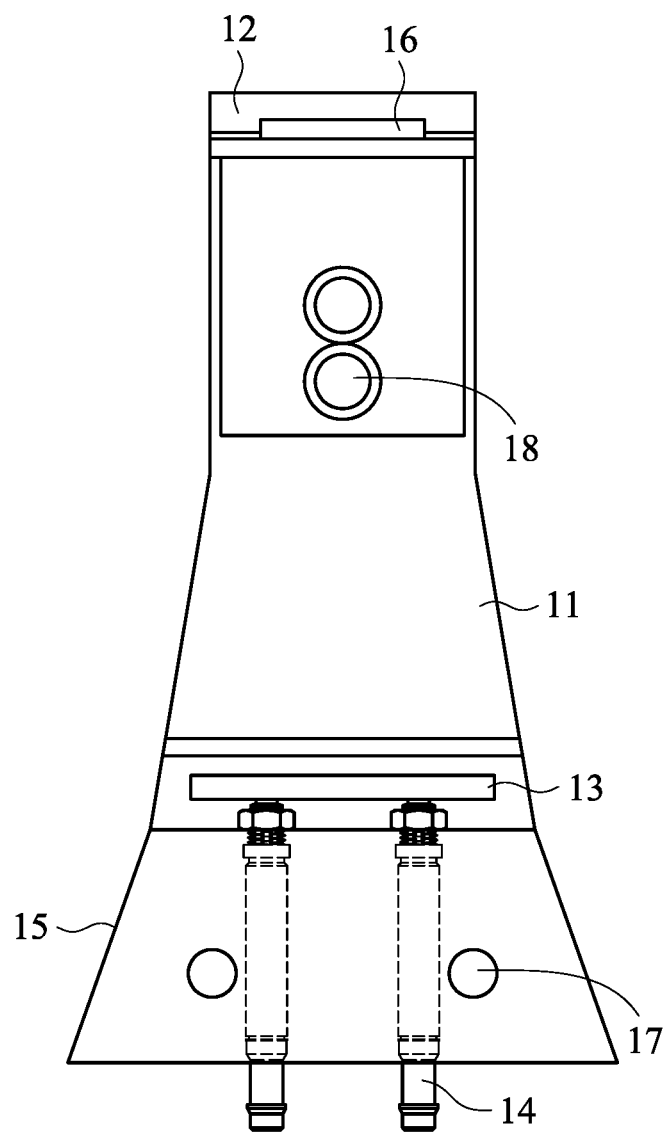
FIG. 2 schematically shows a top view of the wafer clamp of FIG. 1A.

FIG. 1A shows a perspective view of a wafer clamp 100 adaptable to a robot system according to one embodiment of the present invention. FIG. 2 schematically shows a top view of the wafer clamp 100 of FIG. 1A. The wafer clamp 100 of the embodiment is capable of temporarily holding a wafer 10 in a fixed position to prevent movement or separation. The wafer clamp 100 is particularly, but not limitedly, adaptable to hold a wafer without making physical contact with the top or bottom surface of the wafer. The term robotic fork is used instead when the wafer clamp 100 is used as a robotic hand for picking and placing a wafer 10, such as an optical lens or glass, in conjunction with other components of a robot system.

In the embodiment, the wafer clamp 100 may include a platform 11 with a substantially flat top surface. The platform 11 is configured to support the wafer 10 by being beneath the wafer and holding it up.

The wafer clamp 100 of the embodiment may include a stopper 12 disposed at a front end of the platform 11. In the embodiment, the stopper 12 is fixed to the platform 11, and a top surface of the stopper 12 is at a level higher than the top surface of the platform 11. Accordingly, when the wafer 10 rests on the platform 11, the top surface of the stopper 12 is preferably at a level equal to or higher than a top surface of the wafer 10. It is appreciated that, in one embodiment, the stopper 12 may be integrally manufactured with the platform 11. In another embodiment, the stopper 12 and the platform 11 may be individually manufactured, then being fixed together, for example, by adhesive.

The wafer clamp 100 of the embodiment may include a push rod 13 disposed at a rear end of the platform 11. In the embodiment, the push rod 13 is movable with respect to the rear end of the platform 11, and a top surface of the push rod 13 is at a level higher than the top surface of the platform 11. Accordingly, when the wafer 10 rests on the platform 11, the top surface of the push rod 13 is preferably at a level equal to or higher than a top surface of the wafer 10.

The wafer clamp 100 of the embodiment may also include at least one actuator 14 that is pivotally connected to the push rod 13. Specifically, the actuator 14 is configured to move the push rod 13 forward (i.e., toward the front end of the platform 11), such that the wafer 10 may be held tightly between the stopper 12 and the push rod 13. In the embodiment shown in FIG. 1A, two actuators 14 being parallel with each other are pivotally connected to the push rod 13. In another embodiment, one actuator 14 and at least one auxiliary rod (not shown) being parallel with each other are pivotally connected to the push rod 13.

Figure 1B:
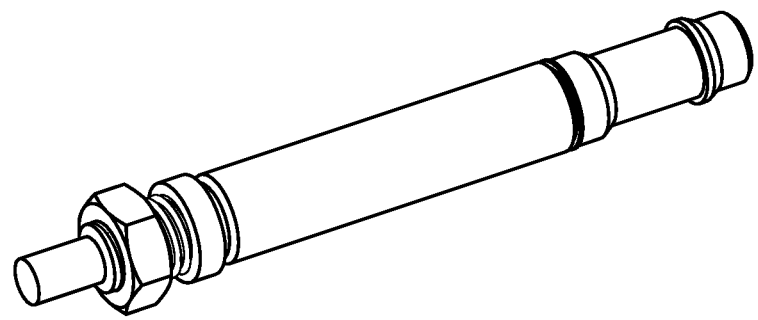
FIG. 1B shows a perspective view of an exemplary pneumatic cylinder according to one embodiment of the present invention.

In the embodiment, the actuator 14 preferably includes a pneumatic cylinder (also known as an air cylinder), which is a mechanical device that uses the power of compressed gas to produce a force in a reciprocating linear motion. The pneumatic cylinder is preferred because of being quieter, cleaner and requiring less amounts of space. FIG. 1B shows a perspective view of an exemplary pneumatic cylinder 14 according to one embodiment of the present invention. A pneumatic cylinder with a model name CJ1 manufactured by Steven Engineering, Inc., California may, but not necessarily, be adopted in the embodiment. Although the pneumatic cylinder is adopted in the embodiment, it is appreciated that other mechanical devices may be used instead.

In the embodiment, the pneumatic cylinder 14 may have a spring return feature, indicating that a front end of the pneumatic cylinder 14 will pull back to an original position by an interior spring (not shown) when the pneumatic cylinder 14 is not actuated. Accordingly, the push rod 13 will be pulled backward (i.e., away from the front end of the platform 11), thereby releasing the wafer 10. In another embodiment, the pneumatic cylinder 14 has no spring return feature, and the push rod 13 may be pulled backward by an exterior spring (not shown) that exerts a force on the push rod 13 in a direction away from the front end of the platform 11. The pneumatic cylinder 14 may be supported by a plate 15. In one embodiment, the plate 15 with the pneumatic cylinder 14 is manufactured and provided as a module, which may be fixed to other part of the wafer clamp 100, for example, by screwing via mounting holes 17.

The wafer clamp 100 of the embodiment may further include a sensor 16 disposed at the stopper 12 or the front end of the platform 11. The sensor 16 is positioned to face upward and is configured to measure a distance between the sensor 16 and an object (the wafer 10 in this case) over the sensor 16. A control signal transmitted to the sensor 16 and a sense signal received from the sensor 16 may be transferred between the sensor 16 and a controller (not shown), which may also control the actuator 14.

Figure 1C:
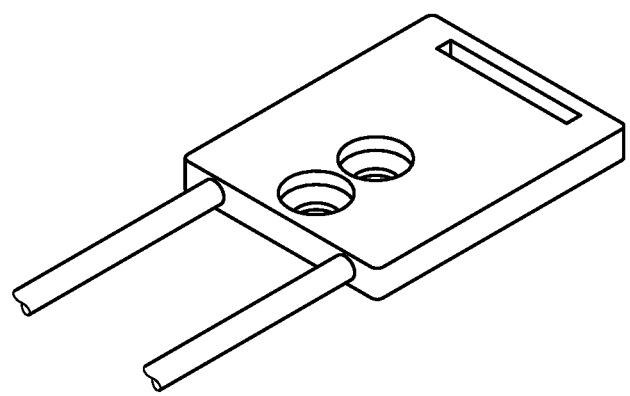
FIG. 1C shows a perspective view of an exemplary fiber optic sensor according to one embodiment of the present invention.

In the embodiment, the sensor 16 preferably includes a fiber optic sensor (e.g., reflective fiber optic sensor), which is a sensor that measures the distance by modifying a fiber so that the quantity to be measured modulates the intensity, phase, polarization, wavelength or transit time of light in the fiber. The fiber optic sensor is preferred because of its small size, immune to electromagnetic interference, resistance to high voltage electricity and temperature. FIG. 1C shows a perspective view of an exemplary fiber optic sensor according to one embodiment of the present invention. A fiber optic sensor with a model name FU manufactured by Keyence Corporation, Taiwan may, but not necessarily, be adopted in the embodiment. In one embodiment, the fiber optic sensor is manufactured and provided as a module, which may be fixed to other part of the wafer clamp 100, for example, by screwing via mounting holes 18. Although the fiber optic sensor is adopted in the embodiment, it is appreciated that other sensors may be used instead.

FIG. 3A to FIG. 3D schematically demonstrate a process flow performed by the wafer clamp 100 of FIG. 1A to pick a wafer 10, for example, from a cassette 31. At first, in FIG. 3A, the wafer clamp 100, acting as a robotic hand of a robot system, moves into a slot of the cassette 31. At this stage, the actuator 14 is not actuated, and the push rod 13 is thus in a backward position (i.e., original position). The sensor 16 detects the presence of the wafer according to a measured first distance d1 between the sensor 16 and the wafer 10 over the sensor 16. In one embodiment, the presence of the wafer 10 is detected while the sensor 16 receives a light signal reflecting back from the wafer 10.

Figure 3A:
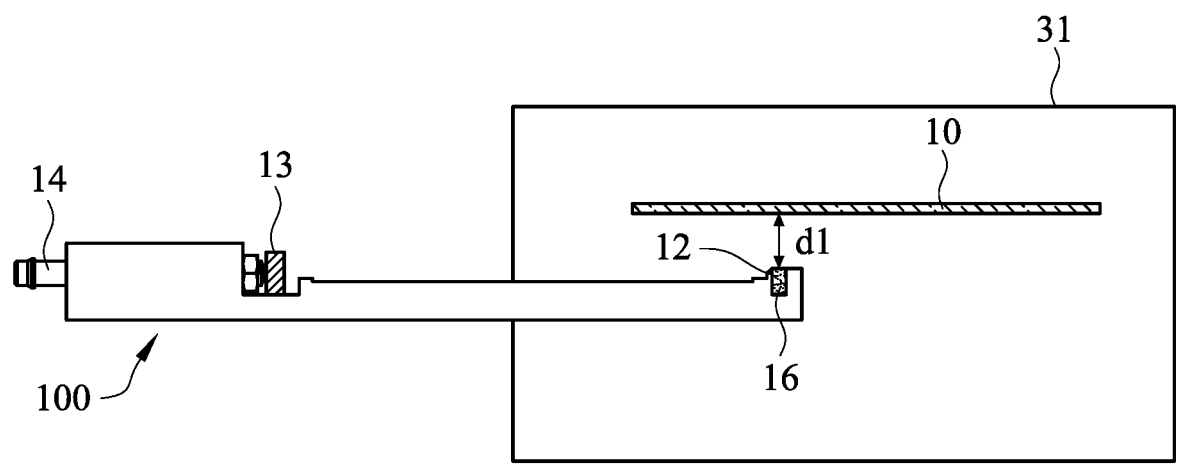
FIG. 3A to FIG. 3D schematically demonstrate a process flow performed by the wafer clamp of FIG. 1A to pick a wafer.
Figure 3B:
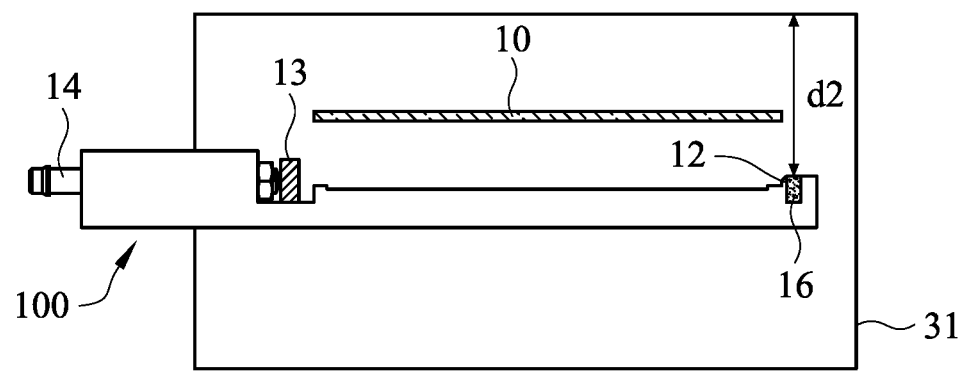

The wafer clamp 100 continues moving forward until the sensor 16 detects the absence of the wafer 10 according to a measured second distance d2 that is greater than the first distance d1 as shown in FIG. 3B. In one embodiment, the absence of the wafer 10 is detected while the sensor 16 receives no light signal reflecting back from the wafer 10.

Figure 3C:
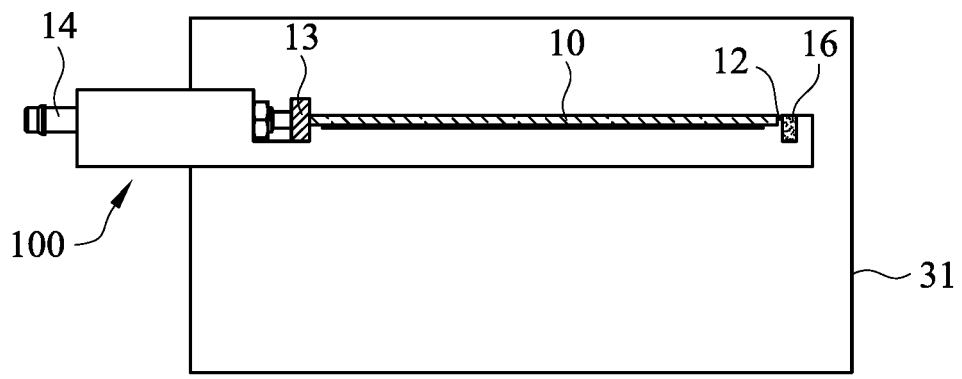
Figure 3D:
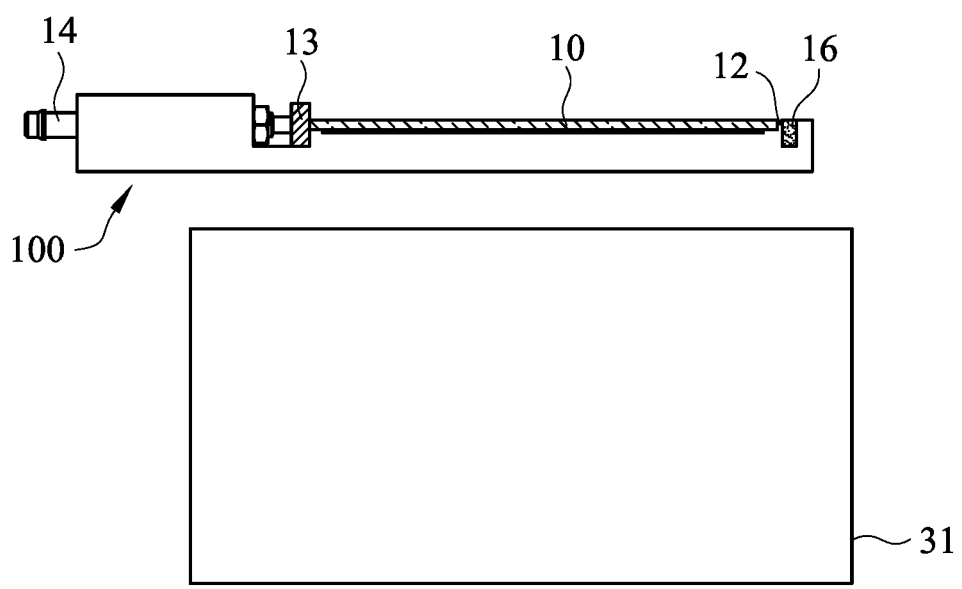
Figure 4:
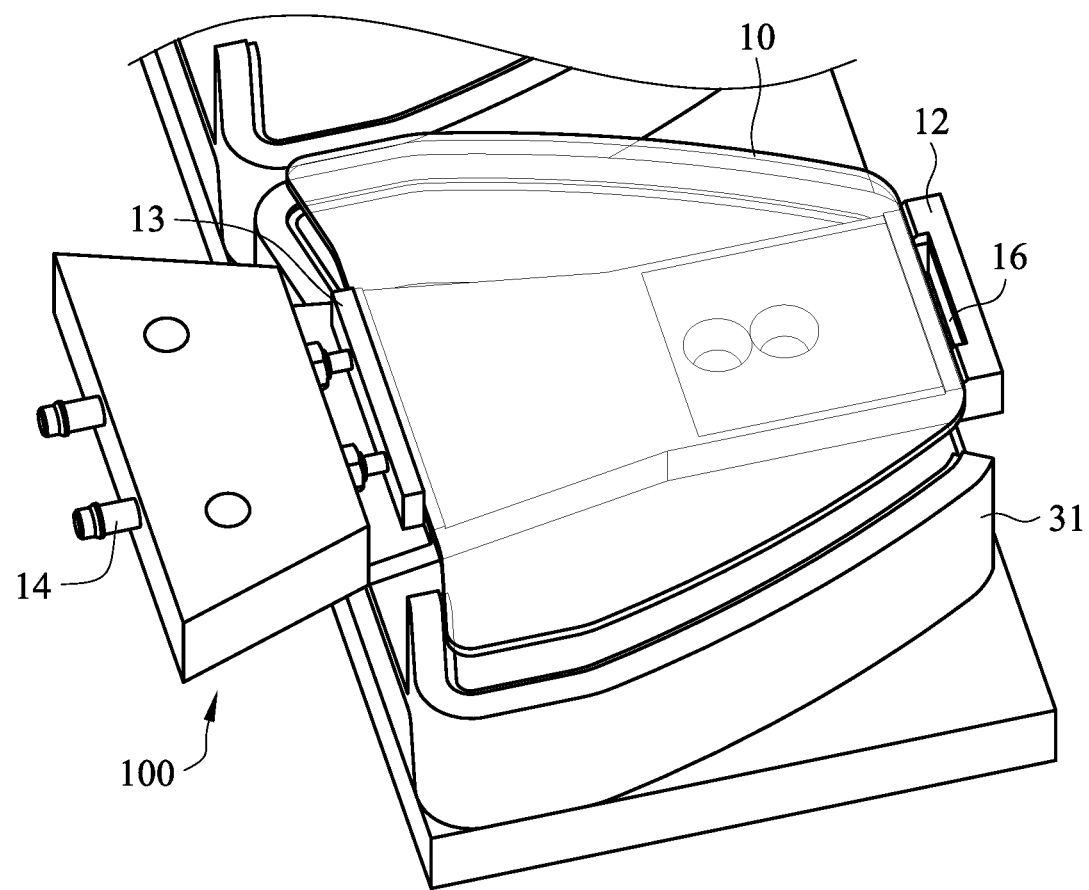
FIG. 4 shows a perspective view of FIG. 3D.

As shown in FIG. 3C, upon detecting the absence of the wafer 10, the wafer clamp 100 moves upward and the actuator 14 is actuated to move the push rod 13 forward (i.e., toward the front end of the platform 11), such that the wafer 10 may be held tightly between the stopper 12 and the push rod 13. Finally, as shown in FIG. 3D, the wafer clamp 100 lifts the wafer 10 away from the cassette 31. A perspective view of FIG. 3D is shown in FIG. 4.

According to the embodiments disclosed above, compared with a vacuum fork, the present invention provides a wafer clamp 100 that is capable of precisely positioning a wafer 10 by using a sensor 16, particularly a fiber optic sensor. The present invention also provides a wafer clamp 100 that is capable of fast moving and rotating without flipping over the wafer 10 by using an actuator 14, particularly a pneumatic cylinder.

Although specific embodiments have been illustrated and described, it will be appreciated by those skilled in the art that various modifications may be made without departing from the scope of the present invention, which is intended to be limited solely by the appended claims.

What is claimed is:

1. A method of clamping a wafer, comprising:
providing a wafer clamp;
moving the wafer clamp forward into a slot with the wafer;
a sensor detecting presence of the wafer over the sensor;
continuously moving the wafer clamp forward until the sensor detects absence of the wafer; and
moving the wafer clamp upward and actuating at least one actuator to move a push rod forward such that the wafer is held tightly between a stopper and the push rod;
wherein the actuator comprises a pneumatic cylinder, and a front end of the pneumatic cylinder pulls back to an original position when the pneumatic cylinder is not actuated.

2. The method of claim 1, wherein the wafer clamp comprises:
a platform;
the stopper disposed at a front end of the platform;
the push rod disposed at a rear end of the platform;
said at least one actuator pivotally connected to the push rod; and
the sensor disposed at the front end of the platform.

3. The method of claim 1, wherein the sensor comprises a reflective fiber optic sensor.

4. The method of claim 3, wherein the presence of the wafer is detected while the reflective fiber optic sensor receives a light signal reflecting back from the wafer.

5. The method of claim 3, wherein the absence of the wafer is detected while the reflective fiber optic sensor receives no light signal reflecting back from the wafer.

\* \* \* \* \*